(12) United States Patent
Fukuda

(10) Patent No.: US 8,607,446 B2
(45) Date of Patent: Dec. 17, 2013

(54) METHOD OF MANUFACTURING AN ELECTRONIC COMPONENT

(75) Inventor: Kenji Fukuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/182,364

(22) Filed: Jul. 13, 2011

(65) Prior Publication Data

US 2011/0269306 A1   Nov. 3, 2011

Related U.S. Application Data

(62) Division of application No. 12/397,944, filed on Mar. 4, 2009, now abandoned.

(30) Foreign Application Priority Data

Mar. 14, 2008  (JP) .................................. 2008-65926

(51) Int. Cl.
*H01R 9/00* (2006.01)
*H05K 3/00* (2006.01)

(52) U.S. Cl.
USPC .................. 29/843; 29/844; 29/846; 29/874; 438/613; 438/616

(58) Field of Classification Search
USPC ............ 29/843, 644, 846, 874, 844; 438/613, 438/616; 257/676, 698, 738, 772, 778, 779, 257/E21.159, E21.503, E21.511, E23.07
See application file for complete search history.

(56) References Cited

FOREIGN PATENT DOCUMENTS

JP          62-281343   * 12/1987   .............. H01L 21/60

* cited by examiner

*Primary Examiner* — Thiem Phan

(57) ABSTRACT

A method of manufacturing an electronic component, which includes arranging a plurality of first electrode pads on a first substrate, and a plurality of second electrode pads on a second substrate, so that the first and second electrode pads correspond to each other. The method further includes forming a plurality of solder bumps on the second electrode pads and putting the first substrate over the second substrate. The first and second substrates are shifted in parallel to each other, in a horizontal direction, while the solder bumps are melting, so that the solder bumps are stretched in a slant direction to cause the solder bumps to be solidified into hourglass-shapes.

2 Claims, 14 Drawing Sheets

METHOD OF MANUFACTURING AN ELECTRONIC COMPONENT

REFERENCE TO RELATED APPLICATION

This is a divisional application of U.S. patent application Ser. No. 12/397,944 filed Mar. 4, 2009 now abandoned and claims the benefit of its priority.

BACKGROUND OF THE INVENTION

1. Technical Field

The present invention relates to a plurality of solder bumps each of which joins electrodes together, an electronic component including the plurality of solder bumps and a method for manufacturing the electronic component. In particular, the present invention relates to an electronic component in which a chip or the like is installed by using of flip chip or BGA (Ball Grid Array), and a method for manufacturing the electronic component.

2. Background Art

As an electronic component, there is a semiconductor component including a substrate on which an LSI chip is mounted. FIG. 13A is a plan view of a general semiconductor component and FIG. 13B is a side view of the general semiconductor component. In FIG. 13A and FIG. 13B, a semiconductor component 100 has a structure that an LSI (Large Scale Integrated circuit) chip 102 having a plurality of electrode pads 101 is mounted over a resin substrate 104 having a plurality of electrode pads 103. In FIG. 13B, each of the electrode pads 101 and each of the electrode pads 103 are joined together via one of solder bumps 105.

When the LSI chip 102 or an apparatus including the semiconductor component 100 is heated, the LSI chip 102 and the resin substrate 104 expand. Since linear expansion coefficient of the resin substrate 104 is generally smaller than that of the LSI chip 102, thermal stress is generated at a joining area of the solder bump 105. Then, exfoliation of the joining area and destruction of the solder bump 105 occur in some cases.

A related art 1 (Japanese Patent Application Laid-Open No. 1998-223693) and a related art 2 (Japanese Patent Application Laid-Open No. 2005-340674) disclose a technology which suppresses exfoliation of the joining area and destruction of the solder bump due to the thermal stress.

The related art 1 discloses a technology that an LSI chip is arranged over a resin substrate, and the LSI chip is lifted from the resin substrate during a heating process. When the LSI chip is lifted while solder bumps are melting, the solder bumps are stretched and become into hourglass-shaped. Here, a contact angle between a peripheral surface of a solder bump and an electrode pad at the joining area (hereinafter, referred simply to as contact angle of joining area) of the hourglass-shaped solder bump is smaller than that of an usual solder bump. When the contact angle of joining area becomes small, the thermal stress which is applied to the joining area is reduced. Accordingly, it is possible to suppress exfoliation of the joining area and destruction of the solder bump.

Meanwhile, the related art 2 discloses a technology that four electrode pads of a LSI chip which are the nearest to corners of the LSI chip are arranged at positions which come off from a aligning position of others on the LSI chip, and all of electrode pads of a resin substrate are arranged at aligning positions on the resin substrate. Accordingly, four solder bumps which are the nearest to corners of an LSI chip slant toward nearby one of the four electrode pads of the LSI chip and solidify into hourglass-shape. When the LSI chip expands larger than the resin substrate during a heating process, the hourglass-shape solder bumps become into upright state. Accordingly, it is possible to suppress exfoliation of the joining area and destruction of the solder bump.

SUMMARY

An exemplary object of the present invention is to provide a solder bump, an electronic component and a method for manufacturing the electronic component, which can suppress exfoliation of a joining area and destruction of the solder bump due to a thermal stress. Moreover, another exemplary object of the present invention is to provide a solder bump which joins together electrode pads, an electronic component including the solder bumps and a method for manufacturing the electronic component, which require neither a complicate process for manufacturing electrode pads nor a precise lifting apparatus.

A plurality of solder bumps according for an exemplary object of the invention join together first electrode pads and second electrode pads at positions which are shifted from opposite positions where the first electrode pads opposite to the second electrode pads. Here, at least a part of the solder bumps are solidified into hourglass-shaped.

An electronic component according for an exemplary object of the invention includes a plurality of first electrode pads arranged on a first substrate, a plurality of second electrode pads arranged at positions corresponding to the first electrode pads on a second substrate and a plurality of solder bumps which join together the first electrode pads and the second electrode pads. Here, the first substrate is located over the second substrate so that the first electrode pads and the second electrode pads are at positions which are shifted from opposite positions where the first electrode pads opposite to the second electrode pads, and at least a part of the solder bumps are solidified into hourglass-shaped.

A method for manufacturing an electronic component according for an exemplary object of the invention includes arranging a plurality of first electrode pads and a plurality of second electrode pads on a first substrate and a second substrate respectively so that positions of the second electrode pads correspond to those of the first electrode pads, forming a plurality of solder bumps on the second electrode pads respectively, putting the first substrate over the second substrate so that the first electrode pads are respectively opposed to the second electrode pads via the solder bumps, shifting the first substrate or said second substrate in parallel to the second substrate while the solder bumps are melting so that the solder bumps are stretched in a slant direction to cause the solder bumps to be solidified into hourglass-shaped.

A method for manufacturing an electronic component according for an exemplary object of the invention includes arranging a plurality of first electrode pads and a plurality of second electrode pads on a first substrate and a second substrate respectively so that positions of the second electrode pads correspond to those of the first electrode pads, forming a plurality of solder bumps on the second electrode pads respectively, putting the first substrate over the second substrate via the solder bumps so that each of the first electrode pads and each of the second electrode pads are at positions which are shifted from their opposite positions to cause the solder bumps to be solidified into hourglass-shaped by heating.

BRIEF DESCRIPTION OF THE DRAWINGS

Exemplary features and advantages of the present invention will become apparent from the following detailed description when taken with the accompanying drawings in which.

EXEMPLARY EMBODIMENT

Exemplary embodiments of the present invention will now be described in detail in accordance with the accompanying drawings.

First Exemplary Embodiment

Figure 1:
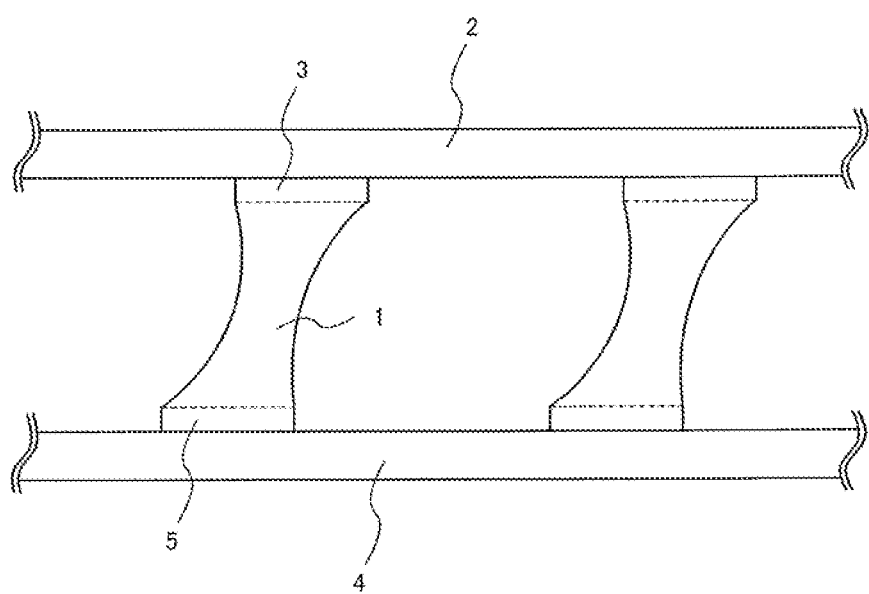
FIG. 1 is a side view of a solder bump of a first exemplary embodiment according to the present invention.

A solder bump of a first exemplary embodiment according to the present invention will be described with FIG. 1. In FIG. 1, two of first electrode pads 3 and two of second electrode pads 5 are arranged on a first substrate 2 and a second substrate 4 respectively so that they are at positions which are shifted parallel to the second substrate 4 from opposite positions where the first electrode pads 3 opposite to the second electrode pads 5. Here, at least a part of plural solder bumps 1 each of which joins one of the first electrode pads 3 and one of the second electrode pads 5 are solidified into hourglass-shaped. In FIG. 1, two solder bumps 1 are hourglass-shaped.

The solder bumps 1 shown in FIG. 1 can be manufactured, for example, as described in the following. That is, creamy solder is supplied on each of the second electrode pads 5 which are formed on the second substrate 4 with the screen printing technology. Then, the first substrate 2 is put over the second substrate 4 so that the first electrode pads 3 are opposed to the second electrode pads 5 each other via the solder and the solders start to be heated in this state. Then, the first substrate 2 and the second substrate 4 are relatively shifted in horizontal direction while the solders are melting, and the solders are stretched in a slant direction because the first electrode pads 3 and the second electrode pads 5 are shifted. Moreover, the solders are cooled in this shifted state and are solidified into hourglass-shaped as solder bumps 1.

Here, a contact angle of joining area of the hourglass-shaped solder bump 1 is smaller than that of usual solder bump. Accordingly, stress which is applied to the joining area of the hourglass-shaped solder bump 1 is reduced and it is consequently possible to suppress exfoliation of the joining area and destruction of the bump 1. Moreover, a precise lifting apparatus is unnecessary on manufacturing the hourglass-shaped solder bump 1 of this embodiment of the present invention.

Here, the smaller the contact angle of joining area of the solder bump 1 becomes, the less stress which is applied to the solder bump 1 becomes, that is, the larger an amount of deformation of the solder bump 1 by shifting becomes, the less stress becomes. However, when an amount of deformation of the solder bump 1 is too large, a possibility that the solder bump 1 is torn off becomes high. So, it is desirable that a shifting length between the first substrate 2 and the second substrate 4 is set to be shorter than diameters each of the electrode pad 11 and the electrode pad 13. In this embodiment, the shifting length is set to be nearly as long as a diameter each of the first electrode pad 3 and the second electrode pad 5. Accordingly, it is possible to maximally reduce the stress which is applied to the joining area of the solder bump 1 in a range where the solder bump 1 is not torn off.

Second Exemplary Embodiment

Figure 2A:
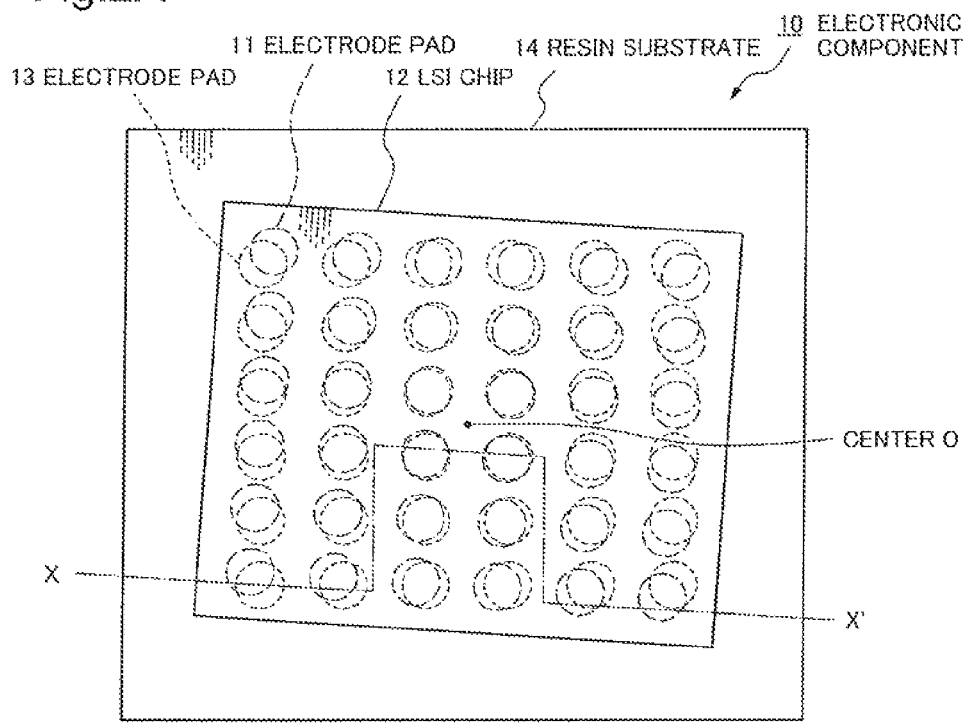
FIG. 2A is a plan view of an electronic component of a second exemplary embodiment.
Figure 2B:
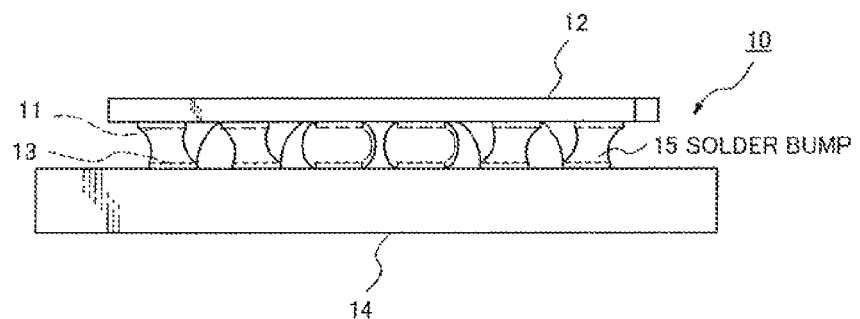
FIG. 2B is a transverse cross-sectional view of the electronic component of the second exemplary embodiment.

An electronic component of a second exemplary embodiment according to the present invention will be described with FIG. 2A and FIG. 2B. FIG. 2A is a plan view of an electronic component 10 of this embodiment. FIG. 2B is a transverse cross-sectional view which is taken along a line X-X' of the electronic component 10 shown in FIG. 2A. In FIG. 2A and FIG. 2B, the electronic component 10 includes an LSI chip 12 which has a plurality of electrode pads 11, a resin substrate 14 which has a plurality of electrode pads 13, and a plurality of solder bumps 15 each of which joins one of the electrode pads 11 and one of the electrode pads 13. Here, the LSI chip 12 is corresponding to the first substrate and the resin substrate 14 is corresponding to the second substrate. Moreover, the electrode pad 11 is corresponding to the first electrode pad and the electrode pad 13 is corresponding to the second electrode pad.

In FIG. 2A, a plurality of electrode pads 11 is formed on the LSI chip 12 in an aligned state, and a plurality of electrode pads 13 is formed on the resin substrate 14 so that positions of electrode pads 13 correspond to those of the electrode pads 11 of the LSI chip 12 each other.

The LSI chip 12 is made of, for example, silicon and the resin substrate 14 is made of general synthetic resin. The electrode pad 11 and the electrode pad 13 are made of conductive metal such as copper. Surfaces of the electrode pad 11 and the electrode pad 13 are coated with a film which has solder wettability and which is made of, for example, gold or solder alloy. The solder bump 15 is made of general lead-free solder.

In FIG. 2A, the electrode pads 11 are not opposed to the electrode pads 13 completely. Each of the electrode pads 11 and each of the electrode pads 13 are at positions which rotate centering on "O" shown in FIG. 2A from their opposite positions. Here, the center O is a center of the LSI chip 12 or the resin substrate 14. In FIG. 2A and FIG. 2B, the electrode pad 11 and the electrode pad 13 are described more exaggeratedly than other part in order to make it easy to understand.

Figure 3A:
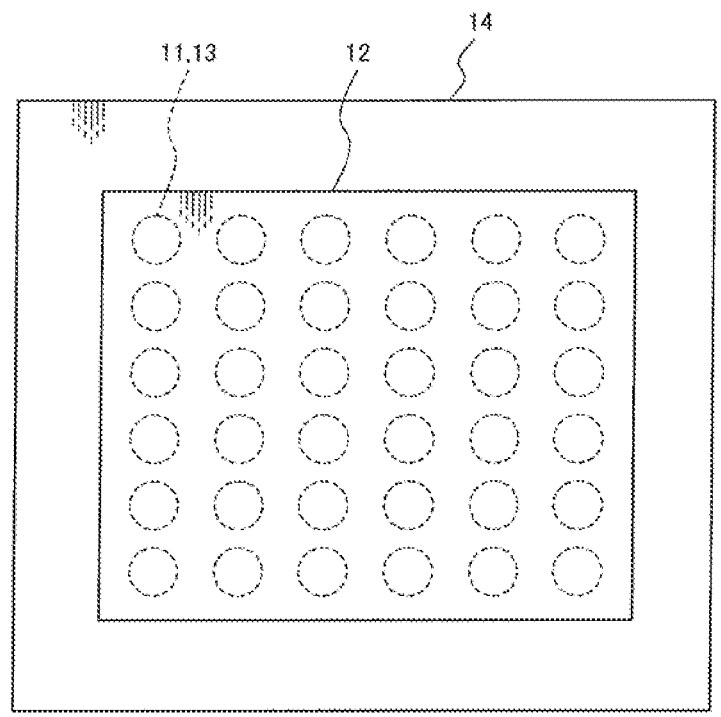
FIG. 3A is a plan view showing a method for manufacturing the electronic component of the second exemplary embodiment.
Figure 3B:
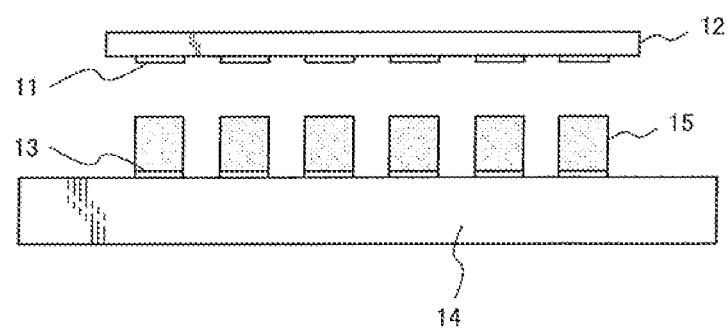
FIG. 3B is a transverse cross-sectional view showing the method for manufacturing the electronic component of the second exemplary embodiment.
Figure 4A:
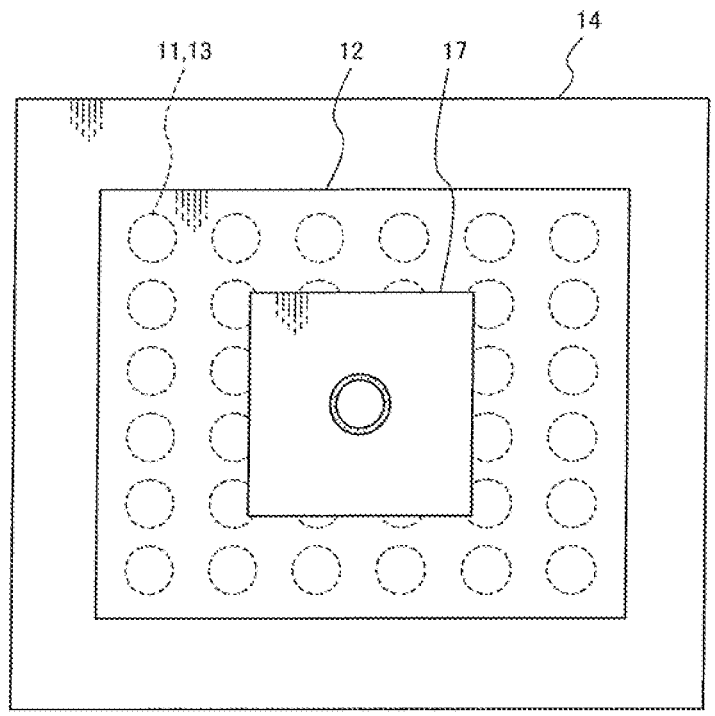
FIG. 4A is a plan view showing the method for manufacturing the electronic component of the second exemplary embodiment.
Figure 4B:
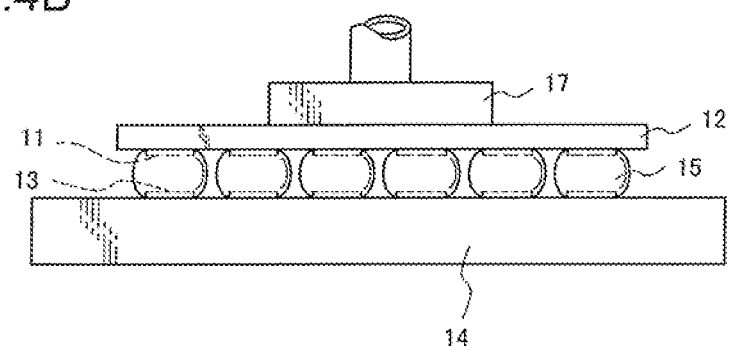
FIG. 4B is a transverse cross-sectional view showing the method for manufacturing the electronic component of the second exemplary embodiment.
Figure 5A:
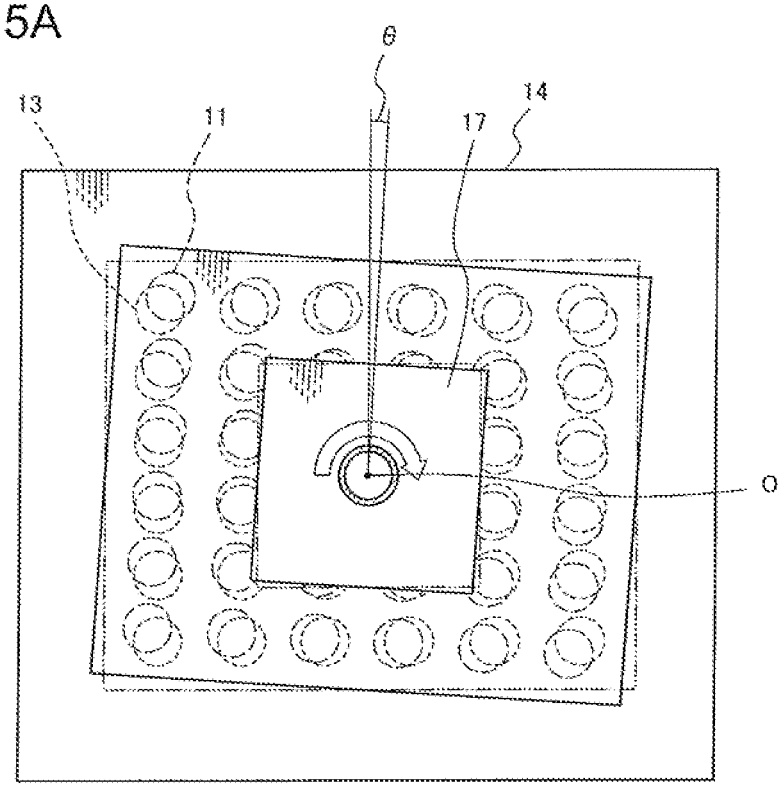
FIG. 5A is a plan view showing the method for manufacturing the electronic component of the second exemplary embodiment.
Figure 5B:
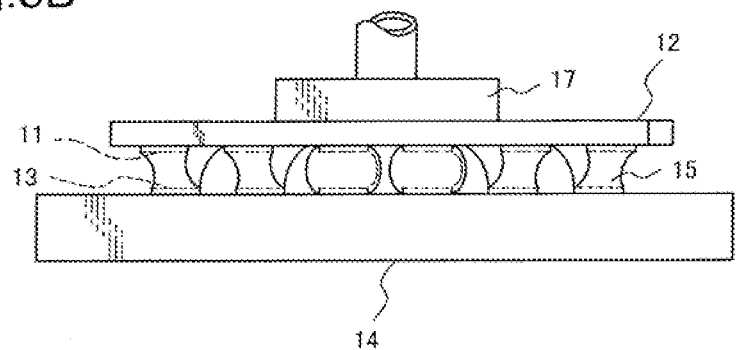
FIG. 5B is a transverse cross-sectional view showing the method for manufacturing the electronic component of the second exemplary embodiment.

Next, a method for manufacturing the electronic component 10 of this embodiment will be described with FIG. 3A to FIG. 5B. FIG. 3A, FIG. 4A and FIG. 5A are plan views of the electronic component 10 in each of manufacturing processes. FIG. 3B, FIG. 4B and FIG. 5B are transverse cross-sectional view of the electronic component 10 in each of manufacturing processes.

In FIG. 3A, the LSI chip 12 and the resin substrate 14 are formed in a shape of square. A plurality of electrode pads 13 are arranged on a mounting surface of the resin substrate 14 in an aligned state, and a plural of electrode pads 11 are arranged on a mounting surface of LSI chip 12 so that positions of electrode pads 11 correspond to those of the electrode pads 13.

When the electronic component 10 is manufactured with the above-mentioned resin substrate 14 and the LSI chip 12, at first, creamy solder is supplied on each of the electrode pads 13 of the resin substrate 14 with the screen printing technique and the solder bumps 15 are formed. The LSI chip 12 is put over the resin substrate 14 so that the electrode pads 11 are opposed to the electrode pads 13 respectively via the solder bumps 15 respectively.

Next, as shown in FIG. 4A and FIG. 4B, a vacuum suction tool 17 is set on a top surface of the LSI chip 12 so that the center of the vacuum suction tool 17 corresponds to the center of the LSI chip 12. Then, the LSI chip 12 and the resin substrate 14 start to be heated in this state.

While the solder bumps 15 are melting, the LSI chip 12 rotates the angle θ in parallel to the resin substrate 14 centering on "O" with the vacuum suction tool 17 as shown in FIG. 5A. Then, the solder bumps 15 are stretched in a slant direction as shown in FIG. 5B. The solder bumps 15 are cooled in this state and are solidified, so the electronic component 10 including the hourglass-shaped solder bumps 15 is manufactured.

In the above-mentioned manufacturing method of the electronic component 10, a precise lifting apparatus is unnecessary. The electrode pads 11 and the electrode pads 13 can be formed with the same method since positions of the electrode pads 13 correspond to those of the electrode pads 11. Accordingly, a complicate process for manufacturing the electrode pad is unnecessary.

Moreover, in the electronic component 10, the contact angle of joining area of the hourglass-shaped solder bump 15 is smaller than that of an usual solder bump. Accordingly, stress which is applied to the joining area is reduced and it is consequently possible to suppress exfoliation of the joining area and destruction of the solder bumps 15.

Here, since surface area of the resin substrate 14 is larger than that of the LSI chip 12, the LSI chip 12 rotates centering on "O" which is a center of the resin substrate 14. The larger a distance from the "O" to the solder bump 15 is, the longer a shifting length between the electrode pads 11 and the electrode pads 13 which are joined by the solder bump 15 is, that is, the bigger an amount of deformation of the solder bump 15 becomes. On the other hand, in general, the stress which is applied to the joining area of the solder bump 15 grows in proportion to the distance from the center of a substrate. Accordingly, in this embodiment, it is possible for the electronic component 10 to reduce effectively the stress on the basis of the stress distribution.

However, when the shifting length between the electrode pads 11 and the electrode pads 13 is too large, a possibility that the solder bump 15 is torn off becomes high. It is desirable that the shifting length between the electrode pads 11 and the electrode pads 13 which are arranged at the farthest position from the center O is shorter than a diameter each of the electrode pad 11 and the electrode pad 13. Then, the rotation angle θ is expressed as $$\theta = \tan^{-1}(d/r)$$

where r is a distance from the center O to one of the solder bumps 15 which is farthest from the center O, and d is a diameter of the electrode pads 11 and the electrode pads 13. In this case, it is possible to maximally reduce the stress which is applied to the joining area of the solder bump 15 in a range where the solder bumps 15 are not torn off.

Here, in this embodiment, while the electrode pads 11 and 13 are arranged in a form of array type as shown in FIG. 2A, these may be arranged in a form of peripheral type. While number of the electrode pads 11 and the electrode pads 13 are "36" respectively, the number is not limited to "36". Furthermore, while a two-layered structure including the LSI chip 12 and the resin substrate 14 is applied to the electronic component 10, a structure of multiple layers including more than three layers may be applied.

Instead of the LSI chip 12A, substrate or the like on which other semiconductor chips or many electronic components are mounted can be applied as the first substrate. Instead of the resin substrate 14, a ceramics substrate, a glass substrate or a semiconductor chip can be applied as the second substrate. Furthermore, shape of top surface of the LSI chip 12 and the resin substrate 14 is not limited to a square, but it may be formed to, for example, a polygon, a circle or an ellipse.

Figure 6:
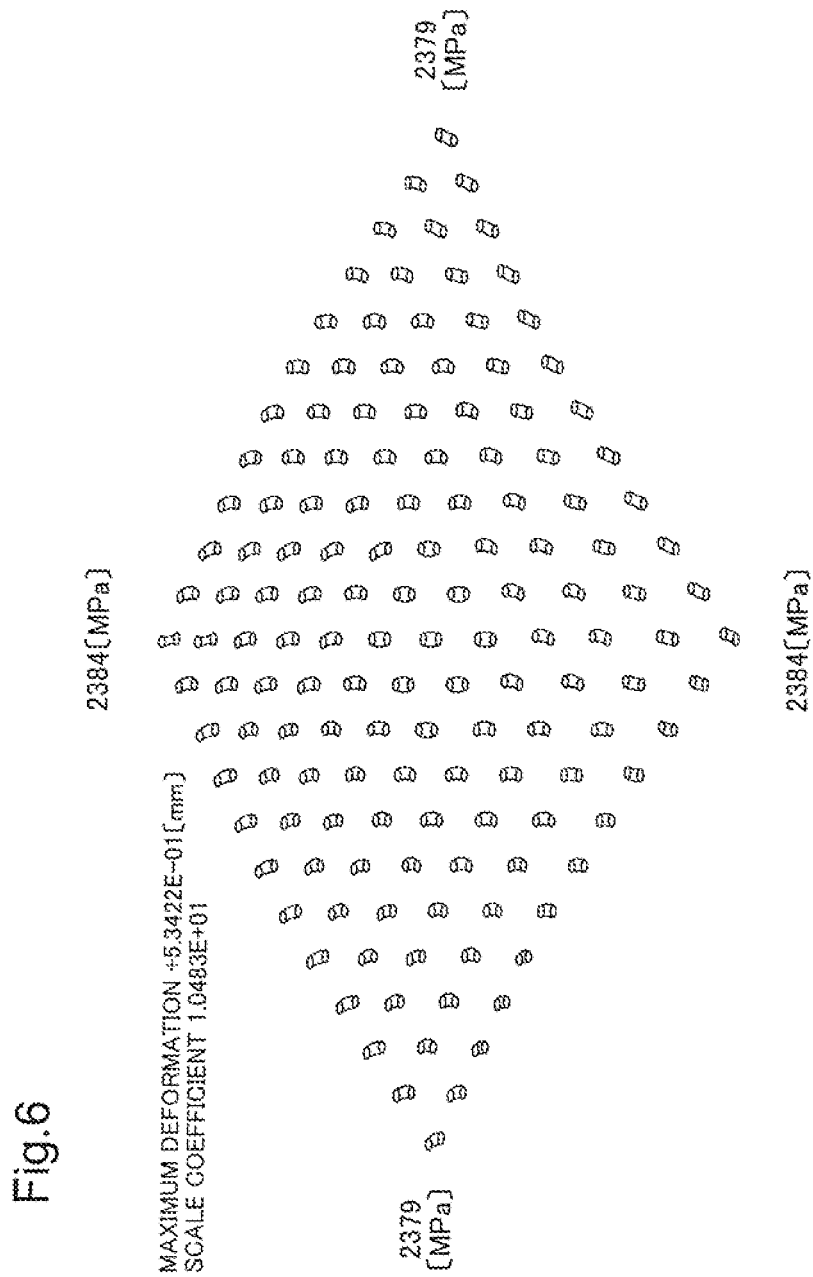
FIG. 6 is a perspective view showing a simulation result on thermal stress of a solder bump in the second exemplary embodiment.
Figure 7:
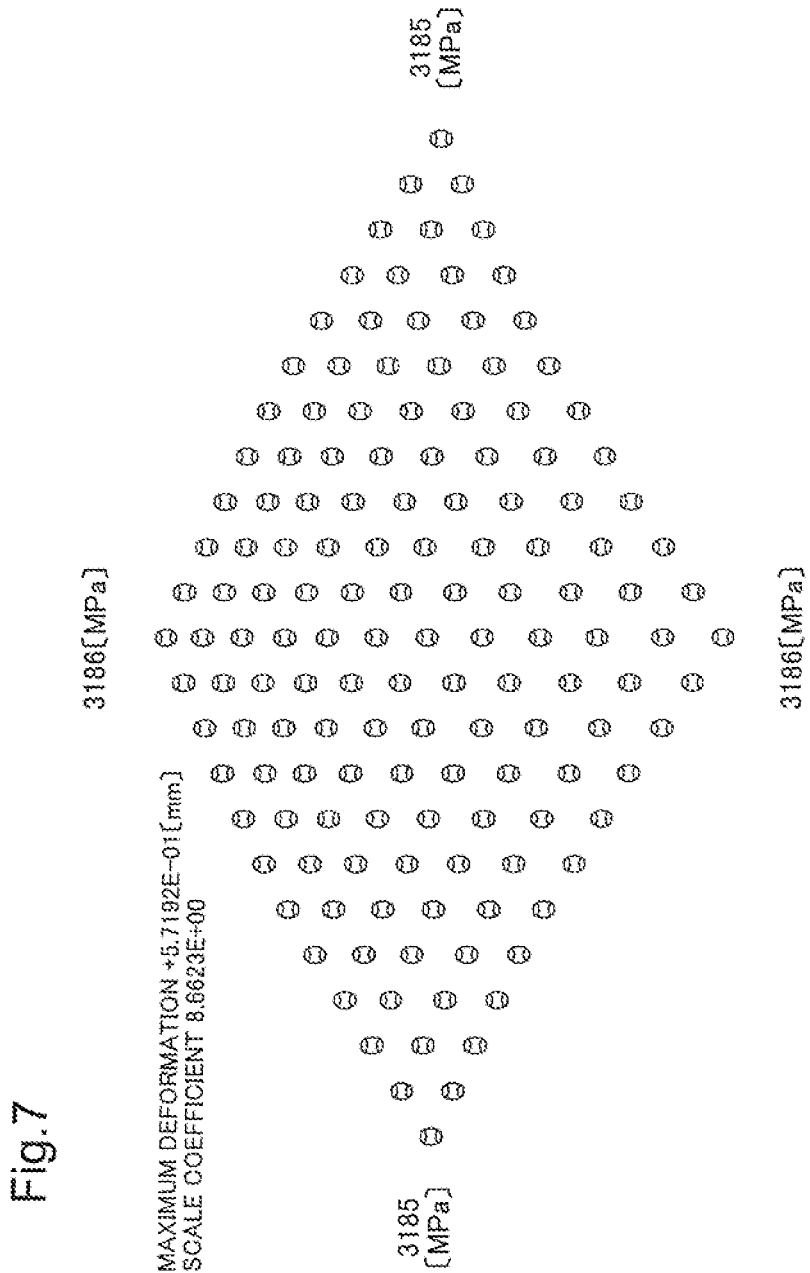
FIG. 7 is a perspective view showing a simulation result on thermal stress of a solder bump of an example to be compared.
Figure 8:
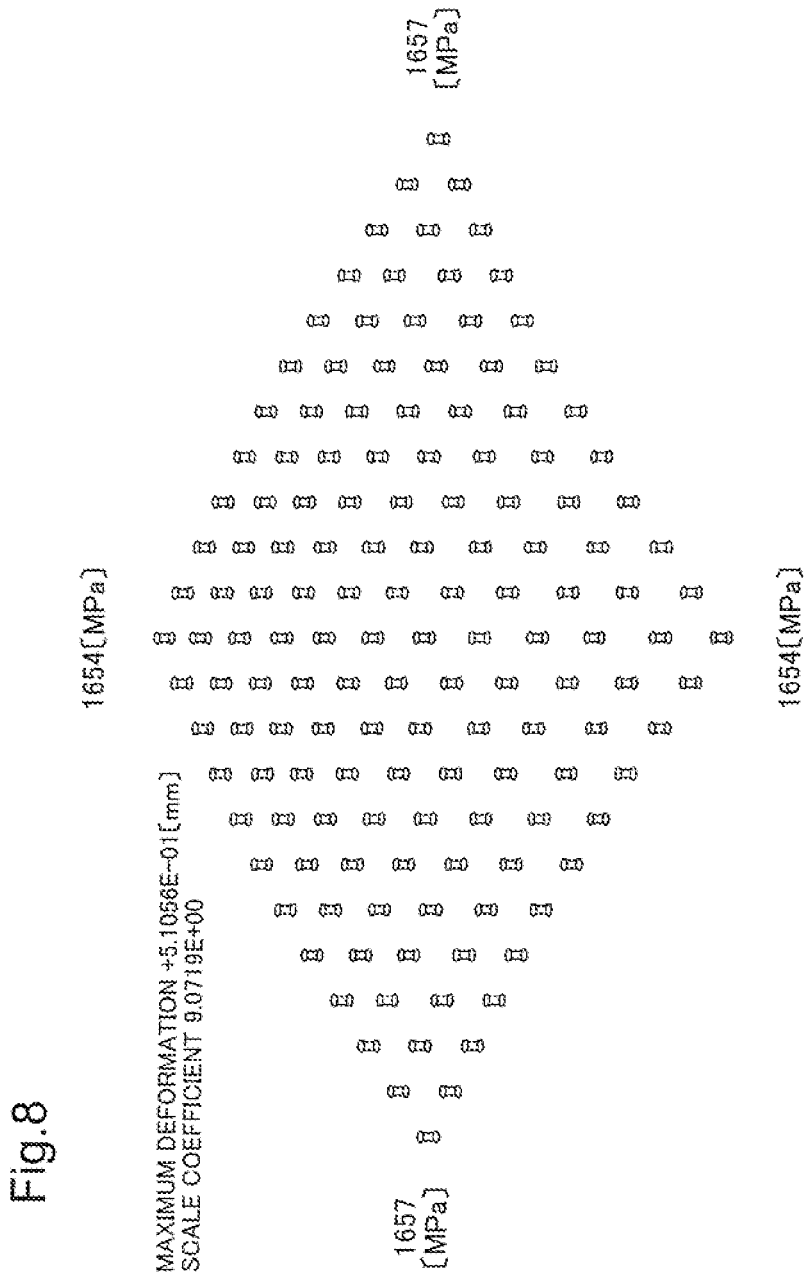
FIG. 8 is a perspective view showing a simulation result on thermal stress of a solder bump of an example to be compared.

Next, a simulation result on thermal stresses of solder bumps will be described. FIG. 6 shows a simulation result of thermal stresses applied to the solder bumps 15 of the electronic component 10 of this embodiment. FIG. 7 shows a simulation result of thermal stresses applied to solder bumps of an usual electronic component. FIG. 8 shows a simulation result of thermal stresses applied to solder bumps of an electronic component all of whose solder bumps are formed to hourglass-shaped.

All of them are the simulation results under that an electronic component including an LSI chip and a resin substrate which are joined together by the solder bumps whose number is "12" times "12", that is, "144", is heated. In FIG. 6 to FIG. 8, stress values which are applied to solder bumps arranged at four corners are indicated near the solder bump in the figure respectively. The stress values are largest since the solder bumps arranged at the four corners are farthest from center of the LSI chip. Here, a scale coefficient in FIG. 6 to FIG. 8 means magnification for expressing an amount of deformation of the solder bump more exaggeratedly than actual deformation. In FIG. 6 to FIG. 8, the scale coefficients are set so that maximum amount of deformation of the solder bump may be corresponding to 10% of the longest length of the analysis model.

In FIG. 6, the maximum stress value of the solder bump is 2384 [MPa] of the electronic component 10 of this embodiment. In FIG. 7, it is 3186 [MPa] of the usual electronic component. In FIG. 8, it is 1657 [MPa] of the electronic component all of whose solder bumps are formed to hourglass-shaped. According, the electronic component 10 of this embodiment can reduce by 25% the maximum thermal stress which is applied to the solder bump compared with that of the usual electronic component, though it can reduce less than that of the electronic component all of whose solder bumps are hourglass-shaped.

Third Exemplary Embodiment

Figure 9A:
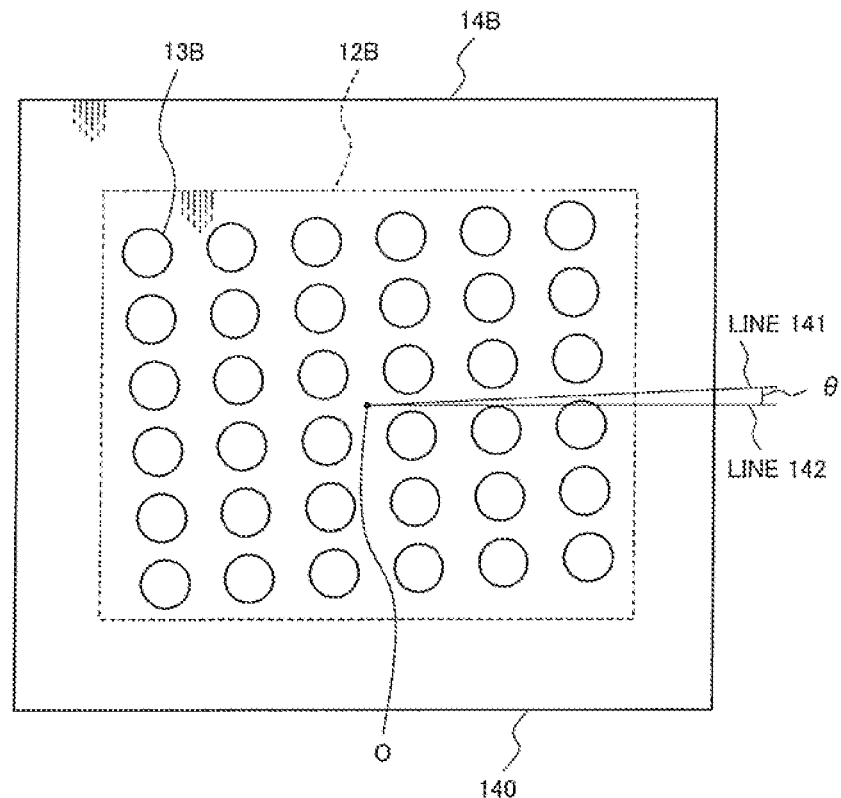
FIG. 9A is a top view of a resin substrate 14 in a third exemplary embodiment.
Figure 9B:
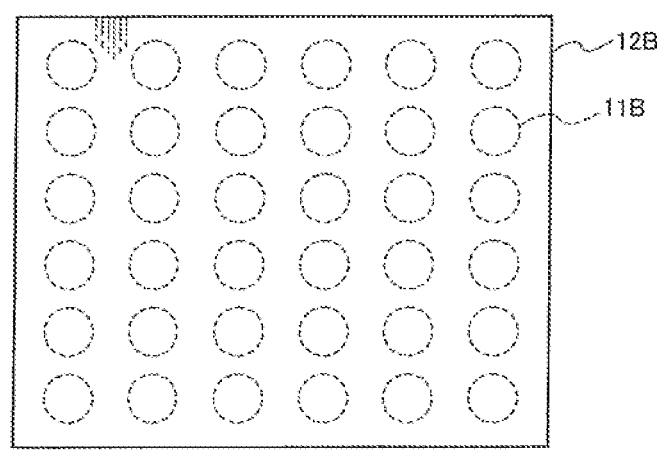
FIG. 9B is a perspective view of a top surface of an LSI chip 12 in the third exemplary embodiment.

A third exemplary embodiment of the present invention will be described in the following. FIG. 9A shows a top view of a resin substrate of an electronic component and FIG. 9B shows a top view of an LSI chip of this embodiment. In FIG. 9A, an area on which an LSI chip 12B is mounted is indicated by a dotted line.

In FIG. 9A, a plurality of electrode pads 13B is arranged on the resin substrate 14B in an aligned state along a line 141 which is at angle θ with a line 142 parallel to an outer edge 140 of the resin substrate 14B. Here, similarly to the second embodiment of the present invention, the angle θ is expressed as $$\theta = \tan^{-1}(d/r)$$

where r is distance from center O to solder bump which is the farthest from the center O, and d is diameter of the electrode pad. In FIG. 9B, a plurality of electrode pads 11B is arranged on the LSI chip 12B in an aligned state along a line which is parallel to an outer edge of the LSI chip 12B.

Figure 10A:
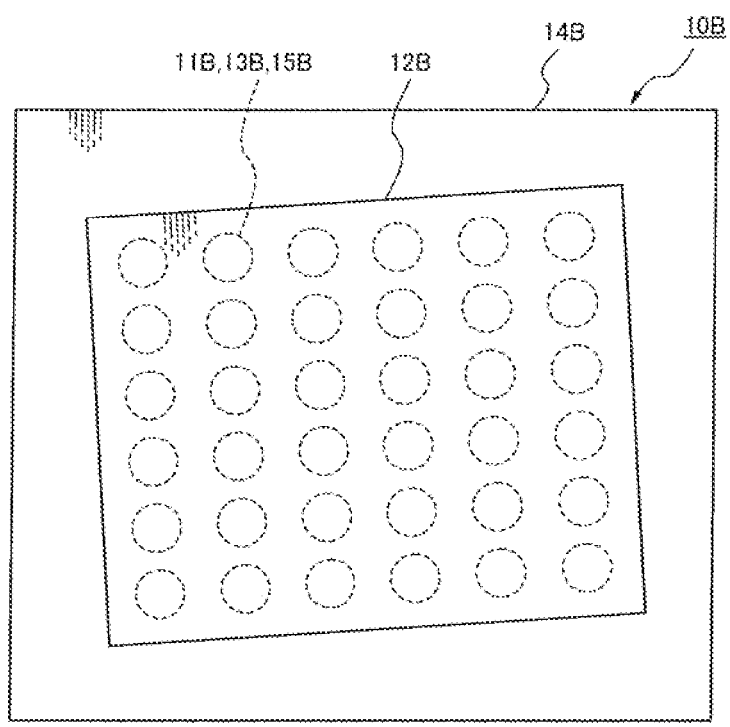
FIG. 10A is a plan view showing a method for manufacturing an electronic component of the third exemplary embodiment.

When an electronic component 10B of this embodiment is manufactured with the resin substrate 14B and the LSI chip 12B, at first, creamy solder is supplied on each of the electrode pads 13B of the resin substrate 14B. Then, the LSI chip 12B is put over the resin substrate 14B so that the electrode pads 11 are opposed to the electrode pads 13B respectively via the solders. FIG. 10A shows a state that the LSI chip 12B is put over the resin substrate 14B.

Figure 10B:
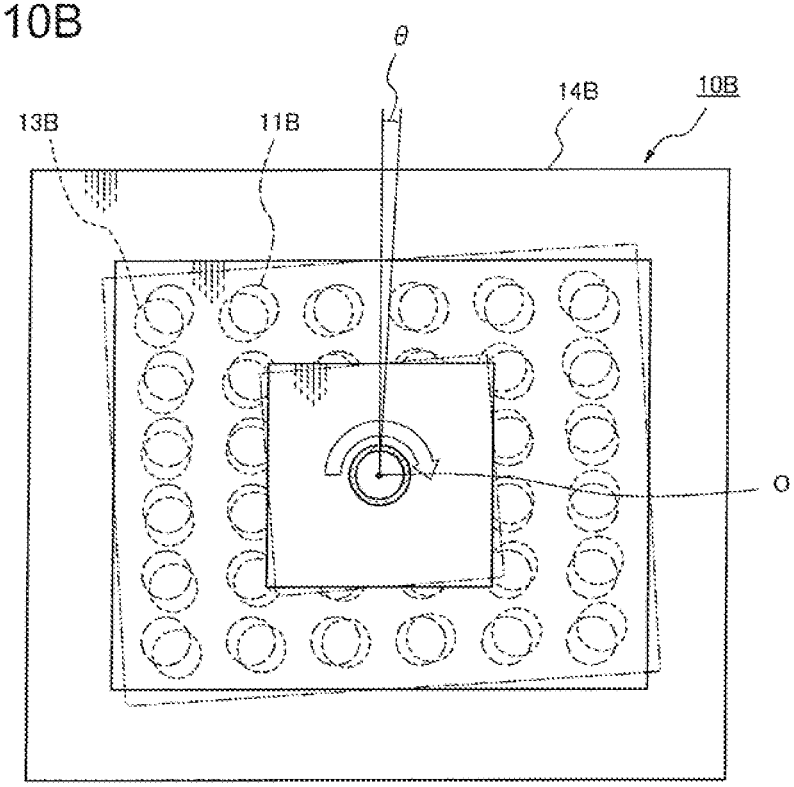
FIG. 10B is a plan view showing the method of manufacturing the electronic component of the third exemplary embodiment.
Figure 10C:
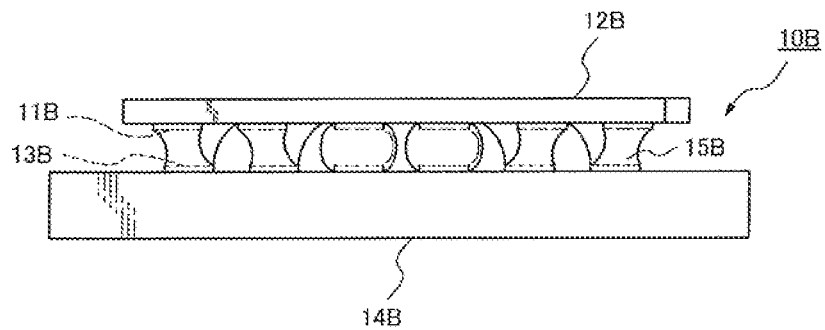
FIG. 10C is a transverse cross-sectional view of the electronic component of the third exemplary embodiment.

The solders are heated in this state. While the solders are melting, the LSI chip 12B rotates the angle θ centering on the center of the resin substrate 14B with a vacuum suction tool or the like. As shown in FIG. 10B, when the LSI chip 12B and the resin substrate 14B rotate the angle θ relatively, each side of the resin substrate 14B and each side of the LSI chip 12B become parallel. Moreover, the solders are stretched in a slant direction as shown in FIG. 10C.

The solders are cooled in this state and are solidified as the solder bumps 15B, so the electronic component 10B including the hourglass-shaped solder bumps 15B in which each side of the resin substrate 14B and each side of the LSI chip 12B become parallel is manufactured.

In the above-mentioned manufacturing method of the electronic component 10B, a precise lifting apparatus is unnecessary. While it is necessary that the electrode pads 13B are arranged along a line which is at the angle θ with the outer edge of the resin substrate 14B, the electrode pads 11B and the electrode pads 13B can be formed with the same method since positions of the electrode pads 13B correspond to those of the electrode pads 11B. Accordingly, a complicate process for manufacturing the electrode pad is unnecessary.

In the electronic component 10C of this embodiment, a contact angle of joining area of the hourglass-shaped solder bump 15B is smaller than that of usual solder bump. Accordingly, stress which is applied to the joining area of the hourglass-shaped solder bump 15B is reduced and it is consequently possible to suppress exfoliation of the joining area and destruction of the solder bump 15B.

Moreover, in this embodiment, the shifting length between the electrode pads 11B and the electrode pads 13B which are arranged at the farthest position from the center O is set to be nearly as long as diameters of the electrode pad 11B and the electrode pad 13B. Accordingly, it is possible to maximally reduce the stress which is applied to the joining area of the solder bump 15B in a range where the solder bumps 15B are not torn off.

Fourth Exemplary Embodiment

Figure 11A:
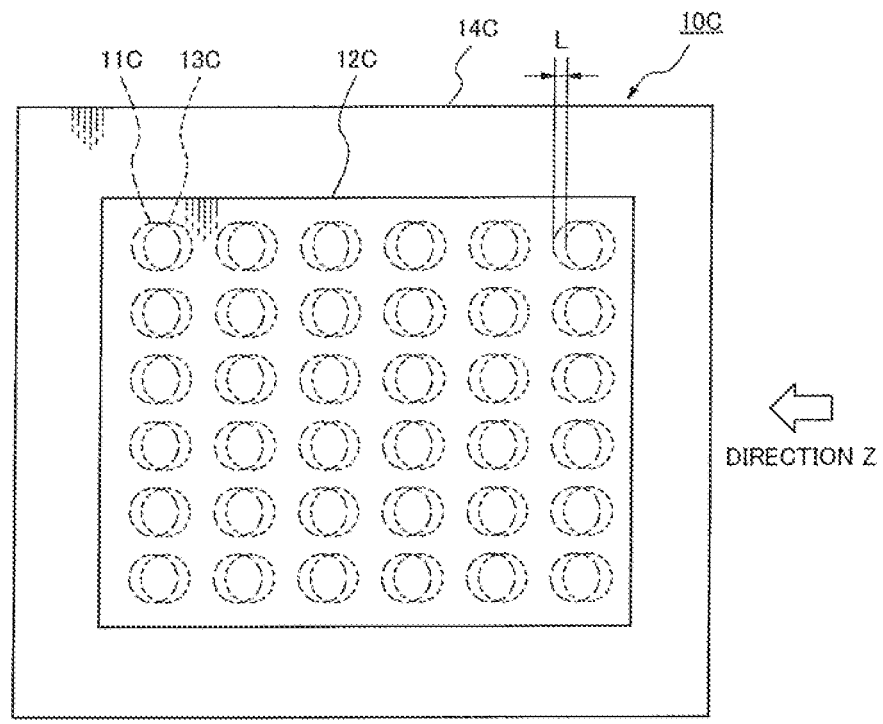
FIG. 11A is a plan view showing a method of manufacturing an electronic component of a fourth exemplary embodiment.
Figure 11B:
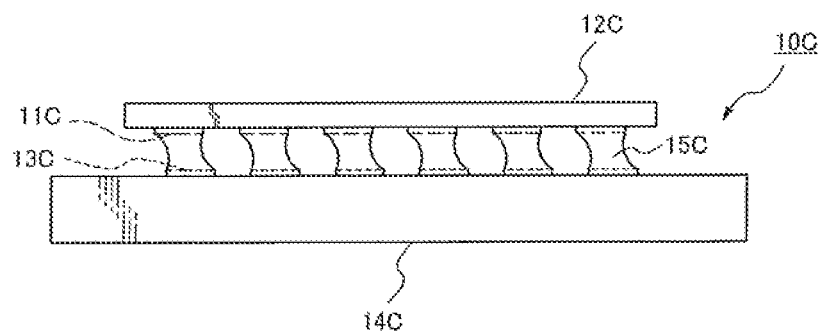
FIG. 11B is a transverse cross-sectional view of the electronic component of the fourth exemplary embodiment.

A fourth exemplary embodiment of the present invention will be described in the following. FIG. 11A is a plan view of an electronic component 10C and FIG. 11B is a side view thereof. In FIG. 11A, the electronic component 10C includes an LSI chip 12C which has a plurality of electrode pads 11C, a resin substrate 14C which has a plurality of electrode pads 13C, and a plurality of solder bumps 15C each of which joins one of the electrode pads 11C and one of the electrode pads 13C.

In FIG. 11A and FIG. 11B, the electrode pads 11C and the electrode pads 13C are arranged at positions which are slid parallel to the resin substrate 14C in one direction from their opposite positions.

When the electronic component 10C is manufactured, at first, creamy solder is supplied on each of the electrode pads 13C of the resin substrate 14C. The LSI chip 12C is put over the resin substrate 14C so that the electrode pads 11C are opposed to the electrode pads 13C respectively via the solders.

In this state, the LSI chip 12C and the resin substrate 14C start to be heated. While the solders are melting, the LSI chip 12C is slid in one direction parallel to the resin substrate 14C. Here, this slid of the LSI chip 12C can be carried out by using a vacuum suction tool or by slanting the resin substrate 19C. Then, the solders are stretched in a slant direction shown in FIG. 11B. The solders are cooled in this state and are solidified as the solder bumps 15C, so the electronic component 10C including the hourglass-shaped solder bumps 15C is manufactured.

In the above-mentioned manufacturing method of the electronic component 10C, a precise lifting apparatus is unnecessary. The electrode pads 11C and the electrode pads 13C can be formed with the same method since positions of the electrode pads 13C correspond to those of the electrode pads 11C. Accordingly, a complicate process for manufacturing the electrode pad is unnecessary.

Moreover, since only sliding the LSI chip 12C is carried out to deform the solder bumps 15C, it is very easy to manufacture the electronic component 10C.

In the electronic component 10C, a contact angle of joining area of the hourglass-shaped solder bump 15C is smaller than that of an usual solder bump. Accordingly, stress which is applied to the joining area is reduced and it is consequently possible to suppress exfoliation of the joining area and destruction of the solder bump 15C.

Here, in this embodiment, the LSI chip 12C is slid by distance L in a direction which is indicated by an arrow Z in FIG. 11A. It is desirable that the distance L, that is, sliding length between opposite the electrode pads is shorter than diameters of the electrode pad 11 and the electrode pad 13. When the distance L is nearly as long as diameters of the electrode pads 11C and the electrode pads 13C, it is possible to maximally reduce the stress which is applied to the joining area of the solder bump 15C in a range where the solder bumps 15C are not torn off.

In this embodiment, the LSI chip 12C is slid in one direction parallel to any side of the resin substrate 14C, however, the LSI chip 12C can be slid, for example, in a diagonal direction of the resin substrate 14C.

Fifth Fourth Exemplary Embodiment

Figure 12A:
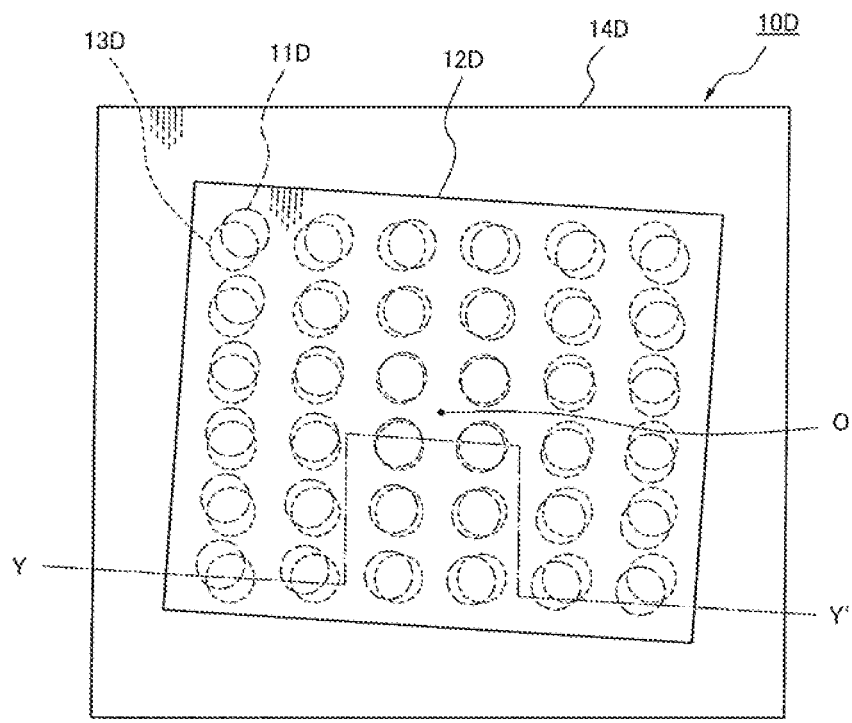
FIG. 12A is a plan view of an electronic component of a fifth exemplary embodiment.
Figure 12B:
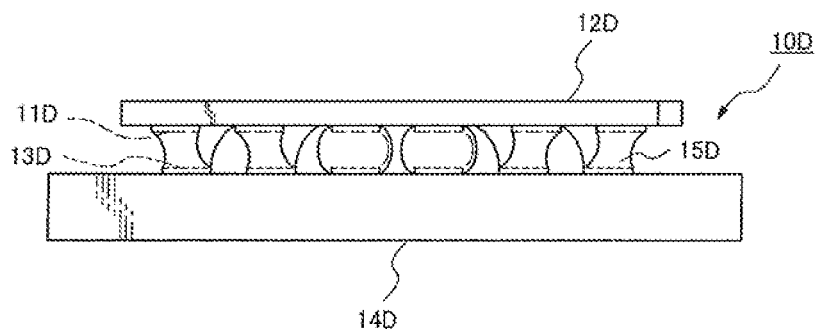
FIG. 12B is a transverse cross-sectional view of the electronic component of the fifth exemplary embodiment.
Figure 13A:
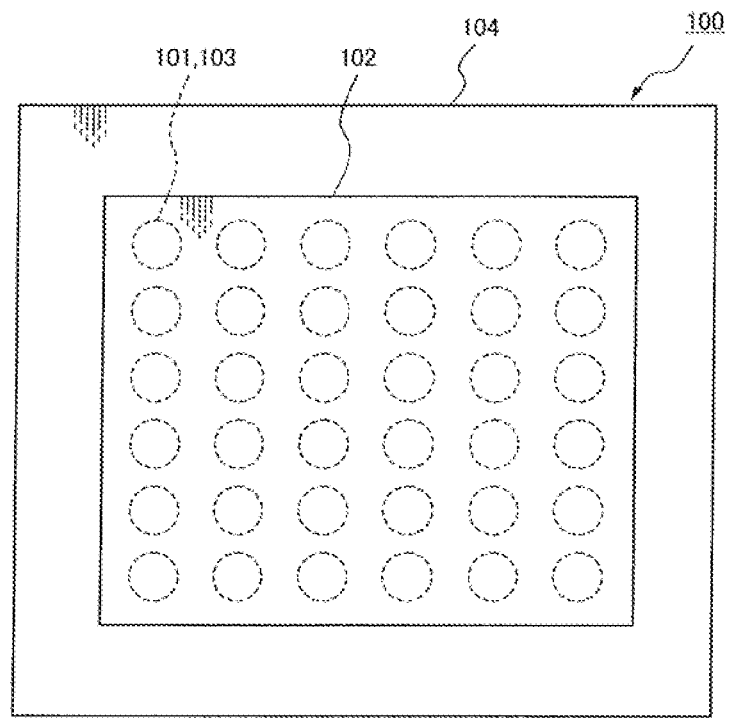
FIG. 13A is a plan view of a general semiconductor component.
Figure 13B:
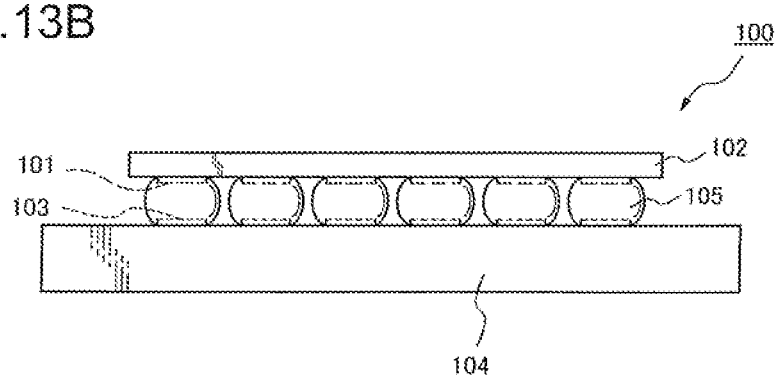
FIG. 13B is a side view of the general semiconductor component.

A fifth exemplary embodiment of the present invention will be described in the following. FIG. 12A is a plan view of an electronic component 10D of this embodiment. FIG. 12B is a transverse cross-sectional view which is taken along a line Y-Y' of the electronic component 10D shown in FIG. 12A. FIG. 12A and FIG. 12B are almost the same as FIG. 2A and FIG. 2B described in the second embodiment of the present invention. That is, each of electrode pads 11D of an LSI chip 12D and each of electrode pads 13D of a resin substrate 14D are at positions which relatively rotate centering on "O" from their opposite positions in FIG. 12A.

But manufacturing method of the electronic component 10D of this embodiment is different from that of the electronic component 10 of the second embodiment. In the second embodiment, the LSI chip 12 is put over the resin substrate 14 so that the electrode pads 11 of the LSI chip 12 are opposed to the electrode pads 13 of a resin substrate 14 respectively via the solders. Then, while the solders are melting, the LSI chip 12 rotates the angle θ in parallel to the resin substrate 14 centering on "O". When the solders are cooled in this rotated state and solidify into hourglass-shaped, the electronic component 10 including the hourglass-shaped solder bumps 15 of the second embodiment is manufactured.

In contrast, in the electronic component 10D of this embodiment, the LSI chip 12D with the electrode pads 11D is put over the resin substrate 14D with the electrode pad 13D so that each of each of the electrode pads 11D and each of the electrode pads 13D are at positions which relatively shifted from their opposite positions. In particular, each of the electrode pads 11D and each of the electrode pads 13D are at positions which are relatively rotated at the angle θ centering on "O" shown in FIG. 12A from their opposite positions. Then, the solders start to be heated in the above state and the solders are melting, and each of the solders slants toward nearby electrode pad 11D. Therefore, there is no rotating operation of the LSI chip 12D during the heating process. Afterward, the solders are cooled and solidify into hourglass-shaped as the solder bumps 15D. Then, the electronic component 10D including the hourglass-shaped solder bumps 15D is manufactured.

In the above-mentioned manufacturing method of the electronic component 10D, neither a precise lifting apparatus nor a complicate process for manufacturing the electrode pad is unnecessary.

In the electronic component 10D, a contact angle of joining area of the hourglass-shaped solder bump 15D is smaller than that of an usual solder bump. Accordingly, stress which is applied to the joining area is reduced and it is consequently possible to suppress exfoliation of the joining area and destruction of the solder bump 15D.

While the present invention has been described with above-mentioned embodiments, the present invention is not limited to each of above-mentioned embodiments. The present invention can include various modifications which a person skilled in the art can understand with regard to configuration and detail of the present invention. Moreover, the present invention can include an appropriate combination of parts or wholes of above-mentioned embodiments of the present invention.

In the electronic component 10, 10B, 10C and 10D according to the above mentioned exemplary embodiments, the maximum length of the shifting between the first electrode pad 11, 11B, 11C and 11D and the second electrode pad 13, 13B, 13C and 13D which are corresponding is shorter than a diameter each of the first electrode pad 11, 11B, 11C and 11D and the second electrode pad 13, 13B, 13C and 13D.

In the electronic component 10, 10B and 10D according to the above mentioned exemplary embodiments, the first electrode pads 11, 11B and 11D and the second electrode pads 13, 13B and 13D are at positions which are rotated parallel to the second substrate 14, 14B and 14D centering on a center of the first or second substrate from the opposite positions.

In the electronic component 10C according to the above mentioned exemplary embodiments, the first electrode pads 11C and the second electrode pads 13C are at positions which are slid in one direction parallel to the second substrate 14C from the opposite positions.

In the electronic component 10, 10B, 10C and 10D according to the above mentioned exemplary embodiments, the first substrate 12, 12B, 12C and 12D is a semiconductor chip and the second substrate 14, 14B, 14C and 14D is a resin substrate.

In the method for manufacturing the electronic component 10, 10B and 10C according to the above mentioned exemplary embodiments, the maximum length of the shifting between the first electrode pad 11, 11B and 11C and the second electrode pad 13, 13B and 13C which are corresponding is shorter than a diameter each of the first electrode pad 11, 11B and 11C and the second electrode pad 13, 13B and 13C.

In the method for manufacturing the electronic component 10, 10B according to the above mentioned exemplary embodiments, the first substrate 12, 12B or the second substrate 14, 14B is shifted so that the first substrate 12, 12B rotates predetermined angle centering on center of the first or second substrate from the opposite positions.

In the method for manufacturing the electronic component 10C according to the above mentioned exemplary embodiments, the first substrate 12C or the second substrate 14C is shifted by sliding in one direction.

In the method for manufacturing the electronic component 10D according to the above mentioned exemplary embodiments, the maximum length of the shifting between the first electrode pad 11D and the second electrode pad 13D which are corresponding is shorter than a diameter each of the first electrode pad 11D and the second electrode pad 13D.

Here, when the related technology which is described in the background art is applied to an electronic component which suppresses exfoliation of the joining area and destruction of the solder bump due to the thermal stress, the related technology has a following problem. That is, according to the related art 1, the LSI chip is lifted from the resin substrate when the solder bump melts. A precise lifting apparatus is needed for lifting the LSI chip.

Moreover, according to the related art 2, a complex process is necessary to manufacture the electrode pads, because it is necessary for the electrode pads at the four corners of the LSI chip to be formed in a different manufacturing process from that of others.

On the other hand, when the electronic component of the present invention is applied to an electronic component which suppresses exfoliation of the joining area and destruction of the solder bump due to the thermal stress, following advantages are made. That is, in the electronic component of the present invention, a first substrate is put over a second substrate so that each of first electrode pads and each of second electrode pads are at positions which are shifted from their opposite positions and at least a part of solder bumps are solidified into hourglass-shaped.

Accordingly, neither a complicate process for manufacturing the electrode pads nor a precise lifting apparatus is necessary on manufacturing the electronic component of the present invention.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

What is claimed is:

1. A method for manufacturing an electronic component, comprising:
    arranging a plurality of first electrode pads on a first substrate along a line which is at an angle θ with respect to a line parallel to an outer edge of the first substrate;
    arranging a plurality of second electrode pads on a second substrate along a line which is parallel to an outer edge of the second substrate;
    forming a plurality of solder bumps on said second electrode pads respectively;
    putting said first substrate over said second substrate so that said first electrode pads are respectively opposed to said second electrode pads via said solder bumps;
    heating the plurality of solder bumps; and
    rotating the first substrate by the angle θ, centering on a center of the first and second substrates, while the plurality of solder bumps are melting, until the outer edge of the first substrate and the outer edge of the second substrate are parallel to each other.

2. The method for manufacturing the electronic component according to claim 1, wherein
    a maximum length of said shifting between said first electrode pad and said second electrode pad is shorter than a diameter of each of said first electrode pad and said second electrode pad.

* * * * *